(12) United States Patent
Naderivesal et al.

(10) Patent No.: US 11,313,894 B2
(45) Date of Patent: Apr. 26, 2022

(54) AUTOMOBILE BATTERY FAILURE PREDICTION METHOD AND SYSTEM

(71) Applicant: INTELEMATICS AUSTRALIA PTY LIMITED, Melbourne (AU)

(72) Inventors: Somayeh Naderivesal, Melbourne (AU); Anna Mary Soldatic, Melbourne (AU); Marcus John Ford, Melbourne (AU); Samuel Warren Beyer, Melbourne (AU)

(*) Notice: Subject to any disclaimer, the term of this patent is extended or adjusted under 35 U.S.C. 154(b) by 0 days.

(21) Appl. No.: 17/094,924

(22) Filed: Dec. 23, 2020

(65) Prior Publication Data

US 2021/0405104 A1 Dec. 30, 2021

(30) Foreign Application Priority Data

Jun. 29, 2020 (AU) .................................. 2020902183

(51) Int. Cl.
*G01R 31/00* (2006.01)
*G01R 31/392* (2019.01)
*B60L 58/16* (2019.01)
*G01R 31/367* (2019.01)

(52) U.S. Cl.
CPC ......... *G01R 31/006* (2013.01); *G01R 31/392* (2019.01); *B60L 58/16* (2019.02); *G01R 31/367* (2019.01)

(58) Field of Classification Search
CPC .... G01R 31/00; G01R 31/006; G01R 31/392; G01R 31/367; B60L 58/16
See application file for complete search history.

(56) References Cited

U.S. PATENT DOCUMENTS

| | | |
|---|---|---|
| 6,727,708 B1 | 4/2004 | Dougherty et al. |
| 6,888,468 B2 | 5/2005 | Bertness |
| 7,061,246 B2 | 6/2006 | Dougherty et al. |
| 7,741,849 B2 | 6/2010 | Frey et al. |
| 8,200,600 B2* | 6/2012 | Rosenstein ............ G06N 7/005 706/46 |
| 8,204,702 B2 | 6/2012 | Center |
| 9,596,287 B2 | 3/2017 | Rybak et al. |
| 9,761,066 B2 | 9/2017 | Chin et al. |
| 2003/0184307 A1* | 10/2003 | Kozlowski .......... H01M 6/5044 324/427 |
| 2004/0140904 A1 | 7/2004 | Bertness |
| 2005/0097207 A1* | 5/2005 | Gluhovsky ........... H04L 41/142 709/224 |

(Continued)

FOREIGN PATENT DOCUMENTS

| | | | | |
|---|---|---|---|---|
| CN | 103336877 A | * | 10/2013 | ............. G06F 17/50 |
| CN | 103336913 A | * | 10/2013 | ............. G06F 19/00 |

(Continued)

OTHER PUBLICATIONS

Australian Patent Office International—Type Search Report and Written Opinion dated May 19, 2021 in connection with Australian Patent Application No. 2020902183.

*Primary Examiner* — Tung S Lau
(74) *Attorney, Agent, or Firm* — Stinson LLP

(57) ABSTRACT

The present invention relates to a battery failure prediction method and system. The invention has particular application to the prediction of vehicle battery failure and will be described with particular reference to that application. However, the invention has more general application.

22 Claims, 10 Drawing Sheets

(56) References Cited

U.S. PATENT DOCUMENTS

| | | | |
|---|---|---|---|
| 2006/0284617 A1* | 12/2006 | Kozlowski | G01R 31/367 |
| | | | 324/426 |
| 2008/0189567 A1* | 8/2008 | Goodnow | G06F 1/3203 |
| | | | 713/340 |
| 2008/0235172 A1* | 9/2008 | Rosenstein | G06N 7/005 |
| | | | 706/46 |
| 2009/0125744 A1* | 5/2009 | Goodnow | G06F 1/3203 |
| | | | 713/330 |
| 2011/0082621 A1 | 4/2011 | Berkobin et al. | |
| 2012/0053837 A1* | 3/2012 | Viassolo | H01M 10/46 |
| | | | 702/1 |
| 2014/0040434 A1 | 2/2014 | Rybak et al. | |
| 2015/0154816 A1 | 6/2015 | Chen et al. | |
| 2016/0041231 A1* | 2/2016 | Lee | G01R 31/382 |
| | | | 702/63 |
| 2017/0038281 A1* | 2/2017 | Dhorajiya | G06Q 10/20 |
| 2018/0143257 A1* | 5/2018 | Garcia | G01R 31/382 |
| 2021/0138927 A1* | 5/2021 | Maeng | G01C 21/3469 |

FOREIGN PATENT DOCUMENTS

| | | | | |
|---|---|---|---|---|
| CN | 109769400 A | * | 5/2019 | H02J 3/32 |
| CN | 112816874 A | * | 5/2021 | G01R 31/392 |
| WO | WO 03071617 A2 | * | 8/2003 | H01M 10/48 |

* cited by examiner

AUTOMOBILE BATTERY FAILURE PREDICTION METHOD AND SYSTEM

CROSS REFERENCE TO RELATED APPLICATIONS

This application claims priority to and the benefit of Australian Provisional Patent Application Serial No. 2020902183, filed Jun. 29, 2020, which is incorporated herein by references in its entirety for all relevant purposes.

FIELD OF THE INVENTION

The present invention relates to a battery failure prediction method and system. The invention has particular application to the prediction of vehicle battery failure and will be described with particular reference to that application. However, the invention has more general application.

BACKGROUND TO THE INVENTION

It is highly desirable to know when a vehicle battery needs replacing. Unexpected failure of a battery can severely inconvenience vehicle owners and operators, while a replacement battery is located and installed. Accordingly, efforts are made to prevent unexpected battery failure.

One typical way of preventing unexpected failure is to set predetermined operational time limits for a battery. For example, a particular battery may have a recommended time of replacement.

Another way is to measure properties of a battery at regular intervals, typically during the regular servicing of the vehicle. For example, the battery voltage may be measured, or the time required for the battery to crank the engine may be measured, and the battery replaced if it is outside prescribed operating limits.

However, the accuracy of these systems is not particularly high, meaning that a battery may be replaced too early (while there is substantial usable life left), or may not be replaced early enough (resulting in an unexpected battery failure). Essentially, the measurements are not sufficiently accurate, and in fact measurements such as, the time to crank the engine may be affected by factors unrelated to the battery.

Accordingly, efforts have been made to more accurately calculate an estimated remaining life of a battery.

For example, related U.S. Pat. Nos. 6,727,708 and 7,061,246 describe methods of monitoring a battery by measuring the battery voltage and temperature at different times. The use of battery temperature is intended to provide a more accurate estimate of remaining battery life. In addition, the methods include techniques which attempt to predict the remaining battery life by starting with an initial value representative of the initial life of the battery, and adjusting it based on an "acceleration factor" calculated by monitoring parameters of the battery. However, this comes with the disadvantage of, inter alia, requiring a separate battery temperature monitoring device. The methods also do not account for various operational factors that may impact on the accuracy of the prediction.

U.S. Pat. No. 8,204,702 also attempts to predict the remaining operating life of a battery more accurately by directly monitoring the temperature of the battery. Again, this requires obtaining an additional measurement of the battery, in an attempt to get a more accurate prediction of the remaining operating life.

U.S. patent application Ser. No. 12/897,690, which was published as US Patent Publication No.: 2011/0082621A1, describes a telematics device or mobile wireless device which receives data related to the vehicle battery's open circuit and cranking voltages, temperature, and usage. The device compares the received data to predetermined corresponding criteria before computing a battery health value based on the received data according to an algorithm. If the received data falls outside the corresponding criteria, the device can generate and send an alert to a user device.

US Patent Application No.: 2004/0140904, which matured as U.S. Pat. No. 6,888,468 to Midtronics, Inc, teaches a battery discharge indicator for protecting a storage battery. The battery discharge indicator includes positive and negative connectors coupled to respective battery terminals along with a voltage sensor that couples to the battery via the connectors to sense a battery terminal voltage. A microprocessor, coupled to the voltage sensor, provides a first alarm signal if a magnitude of the battery terminal voltage is below a first threshold for a first interval of time and if the magnitude of the battery terminal voltage is below a second threshold for a second interval of time.

U.S. Pat. No. 9,596,287, published as US Patent Application No.: 2014/0040434, discloses a system including a data harvesting device connected to a vehicle, the data harvesting device capturing vehicle information and processing the information to generate current vehicle operation data. A computer system is in communication with the data harvesting device and includes a database system for logging the current vehicle operation data. The database system includes a profile for the vehicle configured to store the received current vehicle operation data. The computer system is configured to transmit the current vehicle operation data to one or more remote server computers and operable to enable the sharing of vehicle operation data and related information via social networks.

U.S. Pat. No. 9,761,066, published as US Patent Publication No.: 2015-0154816, teaches a system for monitoring the status of a vehicle utilizing a monitoring unit and a receiver unit. The monitoring unit is operatively connectable to the vehicle via a diagnostic port and detects the voltage output by the vehicle's battery when the vehicle's engine is turned on and off, and voltage output by the alternator while the engine is running. From these voltage measurements, the monitoring unit determines the operational status of the vehicle's battery and alternator by comparison to predefined criteria, such as optimal voltage ranges or a threshold minimum voltage. When the monitoring unit detects that the vehicle's battery or alternator may be malfunctioning, a signal indicating a malfunction is transmitted to, for example, the driver's cellular phone.

U.S. Pat. No. 7,741,849, to Robert Bosch GmbH, teaches a method of predicting a remaining lifetime of battery in which current, voltage and temperature are continuously measured and the period of time until the voltage or charge drop below a specified minimum is calculated using a mathematical model by extrapolation.

Alternative methods and systems for predicting battery failure would be useful.

The reference to any prior art in this specification is not, and should not be taken as, an acknowledgement or any form of suggestion that the prior art forms part of the common general knowledge.

SUMMARY OF THE INVENTION

The present invention is directed to a battery failure prediction method and system.

In a broad form, the invention relates to the use of a plurality of prediction algorithms to provide respective prediction values and computing an overall confidence of prediction using the plurality of respective prediction values.

In a first form, although it need not be the only or indeed the broadest form, the invention resides in a computer-implemented method for predicting battery failure comprising:

calculating a plurality of respective prediction values using a plurality of respective algorithms, each of the plurality of respective algorithms using historical battery data and current battery data;

computing an overall confidence of prediction of battery failure using the plurality of respective prediction values; and providing an indication of predicted battery failure based on the computed overall confidence.

In a second form, the invention resides in a computer-implemented system for predicting battery failure comprising:

one or more processor calculating a plurality of respective prediction values using a plurality of respective algorithms, each of the plurality of respective algorithms using historical battery data and current battery data;

the one or more processor computing an overall confidence of prediction of battery failure using the plurality of respective prediction values; and the one or more processor providing an indication of predicted battery failure based on the computed overall confidence.

In a third form, the invention resides in a computer program product comprising:

a computer usable medium and computer readable program code embodied on said computer usable medium for predicting battery failure comprising:

computer readable program code devices (i) configured to cause the computer to calculate a plurality of respective prediction values using a plurality of respective algorithms, each of the plurality of respective algorithms using historical battery data and current battery data;

computer readable program code devices (ii) configured to cause the computer to compute an overall confidence of prediction of battery failure using the plurality of respective prediction values; and computer readable program code devices (iii) configured to cause the computer to provide an indication of predicted battery failure based on the computed overall confidence.

The indication of predicted battery failure may be a confidence percentage that the battery will fail within a predetermined amount of time. The predetermined amount of time may comprise a fuzzy logic duration such as, soon. The predetermined amount of time and/or fuzzy logic duration may comprise 7 days; 14 days; 21 days; 28 days; 1 month; 6 weeks; 2 months; 3 months; 6 months; or 12 months.

The plurality of algorithms may comprise one or more of: a rule based algorithm; a random forests algorithm; a deep learning algorithm; and/or a support vector machine algorithm. Each of the plurality of algorithms may indicate a respective confidence level in its prediction of battery failure or non-failure. In a particular embodiment the plurality of algorithms comprises a rule based algorithm; a random forests algorithm; a deep learning algorithm; and a support vector machine algorithm. The plurality of algorithms may comprise two; two or more; three; three or more; four; four or more; five; five or more; six; six or more; seven; seven or more; eight; eight or more; nine; nine or more; ten; or ten or more algorithms. At least one or each of the plurality of algorithms may comprise a machine learning algorithm.

According to any one of the above aspects, a selection of the plurality of algorithms may be performed. The selection may be based on the device information.

According to any one of the above aspects, modern vehicles measure the voltage of the battery and provide it to a data transmission device such as, the central computer of the vehicle, or a dongle or other device connected to the vehicle's computer interface. Accordingly, in one embodiment of any one of the above aspects, the present invention operates to predict battery failure by relying on standard data obtained during operation of the vehicle and received from the transmission device. The standard data may be comprised in the historical battery data and current battery data.

The historical battery data and current battery data may comprise input data.

At least some of the historical battery data may be received from the transmission device and/or from a database or other source.

At least some of the current battery data may be received from the vehicle and/or from a database or other source. The current battery data may be obtained based on one or more input from a vehicle's central computer.

The historical battery data may comprise at least one historical trip of a vehicle. The historical battery data may comprise 1; 2; 3; 4; 5; 6; 7; 8; 9; 10; 11; 12; 13; 14; 15; 16; 17; 18; 19; 20; 21; 22; 23; 24; 25; 30; 35; 40; 45; 50; 60; 70; 80; 90; 100; 150; 200; 300; 400 or 500 historical trips. The historical battery data may comprise at least 2; at least 3; at least 4; at least 5; at least 10; at least 15; at least 20; at least 25; at least 30; at least 40; at least 50; at least 60; at least 70; at least 80; at least 90; or at least 100 historical trips.

The current battery data may comprise current intrinsic battery data such as, one or more of the minimum crank voltage of the battery; voltage of the battery immediately before cranking; resting voltage; engine time to start; battery temperature; and one or more battery specification. The current one or more battery specification may comprise one or more of manufacturer; type; and batch. The minimum crank voltage may be reported during the trip.

The historical battery data may comprise historical intrinsic battery data such as, one or more of the minimum crank voltage of the battery; voltage of the battery immediately before cranking; resting voltage; engine time to start; battery temperature; and one or more battery specification. The historical one or more battery specification may comprise one or more of manufacturer; type; and batch.

The current battery data may further comprise current vehicle data such as, one or more of vehicle make; vehicle model; vehicle year; vehicle unique identification.

The historical battery data may further comprise historical vehicle data such as, one or more of vehicle make; vehicle model; vehicle year; vehicle unique identification.

The current battery data may comprise current auxiliary data such as transmission device specification.

The historical battery data may comprise historical auxiliary data such as transmission device specification.

The current auxiliary data and historical auxiliary transmission device specification may comprise respective one or more of transmission device manufacture; transmission device configuration; and detail of voltage sampling frequency.

The current battery data may further comprise extrinsic data such as, one or more of ambient temperature data; location data; a trip start time; and a trip end time.

The historical battery data may further comprise extrinsic data such as, one or more of ambient temperature data; location data; a trip start time; and a trip end time.

The current battery data and historical battery data location data may comprise current trip start location and current trip end location and historical trip start location and historical trip end location, respectively. The location data may comprise latitude and longitude coordinates.

According to any one of the above forms, the ambient temperature data may be obtained by querying an online database such as, a weather database, using location data and/or one or more of trip start time and trip end time comprised in the historical battery data or current battery data.

According to any one of the above forms, the location data may be obtained using GPS data to ensure ambient temperature from the correct location.

According to any one of the above forms, the trip start location and/or trip end location may be used to obtain a trip temperature from, for example, a weather database. The ambient temperature data may be received or obtained from the transmission device or a database.

In one particular embodiment the input data comprises:
historical battery data for x trips, for example 30 trips or 100 trips, comprising: vehicle unique identification; transmission device specification; trip start and/or end time; ambient temperature; and minimum cranking voltage;
current battery data comprising: vehicle unique identification; trip start and/or end time; ambient temperature; and minimum cranking voltage;
and sourced from either historical battery data or current battery data: transmission device type; transmission device detail of voltage sampling frequency; vehicle make; vehicle model; and vehicle year.

According to any one of the above forms, the current battery data may comprise an ongoing or most recent trip relating to the battery of the vehicle.

Battery data measured for one trip may subsequently be recorded as historical battery data. Accordingly, over time, the amount of data used for the failure calculation increases.

According to any one of the above forms, the historical battery data may comprise one or more averaged historical parameter such as, averaged historical minimum cranking voltage. The averaged historical parameter may be averaged over the complete historical battery data set or a subset thereof. The subset may exclude one or more outlier selected such as due to an extreme temperature or adverse event such as, low voltage due to abnormal battery load for example, due to lights or other auxiliary left on.

According to any one of the above forms, the historical battery data and current battery data may comprise a data subset for each trip. Each data subset may comprise any one or more of intrinsic battery data; vehicle data; and auxiliary data.

In a particular embodiment, each of the current battery data and historical battery data intrinsic vehicle data comprises at least the minimum cranking voltage. In another particular embodiment, the resting voltage may be nullable.

According to any one of the above forms, the prediction may be triggered by a trip end. The trip end may initiate a trip data package comprising trip or current battery data.

According to any one of the above forms, the computation of an overall confidence may comprise one or more of: a latest failure prediction date; the latest failure prediction date feedback; and a latest prediction for one or more of the plurality of respective algorithms. The latest prediction may comprise a cross-validation value such as, a k fold cross validation or k*I-fold cross-validation. The cross-validation value may comprise a k value.

According to any one of the above forms, the computation of an overall confidence comprises one or more respective historical prediction for each respective plurality of respective algorithms as an input. The one or more historical prediction may be based on one or more rule. The one or more rule may comprise summing the respective prediction values.

The method or system may further comprise providing an indication to a user of predicted battery failure. The indication may be provided if the estimated likelihood of failure is above a threshold likelihood. The threshold likelihood may be likelihood that is greater than a % value within a predetermined amount of time. The indication may be provided via various apparatus, including via a specialised indication device provided to the user; via the vehicle dashboard if the method is implemented by or integrated with the vehicle's central computer; via a website accessible by the user; or via a computer program such as an app installed on a mobile computing device associated with the user (such as a mobile phone or tablet computer). The indication may only be provided if the prediction is failure.

According to any one of the above forms, a detection rate of at least 50%; at least 60%; at least 70%; or 70% may be comprised.

According to any one of the above forms, an accuracy of at least 50%; at least 60%; at least 70%; or 70% may be comprised.

Further aspects and/or features of the present invention will become apparent from the following detailed description.

BRIEF DESCRIPTION OF THE DRAWINGS

In order that the invention may be readily understood and put into practical effect, reference will now be made to embodiments of the present invention with reference to the accompanying drawings, wherein like reference numbers refer to identical elements. The drawings are provided by way of example only, wherein.

Figure 1:
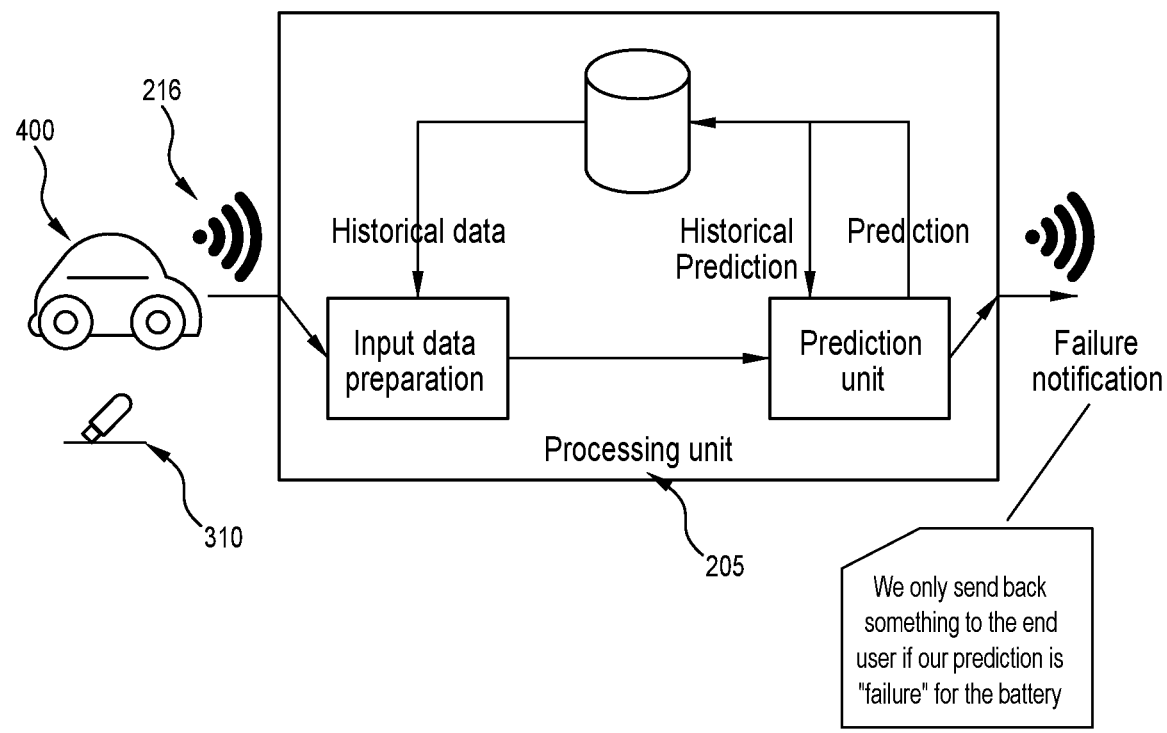
FIG. 1 is flowchart illustrating partial data flow according to an embodiment of the present invention.

Skilled addressees will appreciate that elements in the drawings are illustrated for simplicity and clarity and have not necessarily been drawn to scale. For example, the relative dimensions of some elements in the drawings may be distorted to help improve understanding of embodiments of the present invention.

DETAILED DESCRIPTION OF THE INVENTION

The present invention relates to a battery failure prediction method and system.

The invention is at least partly predicated on the unexpected discovery that the use of a plurality of prediction algorithms to provide respective prediction values and then computing an overall confidence of prediction using the plurality of respective prediction values can be useful for providing a predication of battery failure.

Advantageously, the method and system of the invention may be provided as part of a predictive battery failure and/or breakdown services.

The present invention is of significant advantage and utility because, in one embodiment it predicts a battery failure and/or a breakdown of a vehicle, before it happens. In particular, in one embodiment, the present invention predicts a battery failure "x" days or weeks before it happens.

The present invention makes use of the measurements and data collected by modern vehicles such as, the measurement of battery voltage, which are provided to a data transmission device such as, the central computer of the vehicle, or a dongle or other device connected to the vehicle's computer interface. That is, advantageously, in one embodiment, the present invention predicts battery failure by relying on standard and readily available data obtained during conventional operation of a vehicle, which may be received from the transmission device or otherwise obtained from a database. The standard data may be comprised in input data comprising both historical battery data and current battery data.

As illustrated in FIGS. 1, 7, 8, 10A and 10B, in one embodiment, method 100 and system 300 of the invention uses the following components: a data transmission device 310; one or more processor 205; and a network connection 216.

In the embodiment shown in FIG. 1, the data transmission device 310 is in the form of a dongle device connected to an OBD (on-board diagnostics) port of vehicle 400. The data transmission device 310 provides the input data. In other embodiments, the input data is obtained or received from one or more database such as, database 292; or a memory which for example, comprises a built-in dashboard that is able to provide the required input data.

As will be elucidated below, the one or more processor 205 receives the input data and processes it.

The network connection 216 allows operative communication between the data transmission device 310 and remote processor 205 and, optionally, for receiving an indication of predicted battery failure.

Advantageously, the indication may be provided if the estimated likelihood of failure is above a threshold likelihood such as, if the likelihood is greater than a % value within a predetermined amount of time. The indication may be provided via various apparatus, including via a specialised indication device provided to the user; via the vehicle dashboard if the method is implemented by or integrated with the vehicle's central computer; via a website accessible by the user; or via a computer program such as an app installed on a mobile computing device associated with the user (such as a mobile phone or tablet computer).

FIG. 1 shows one embodiment of how components 310, 205 and 216 interact with each other.

Figure 9:
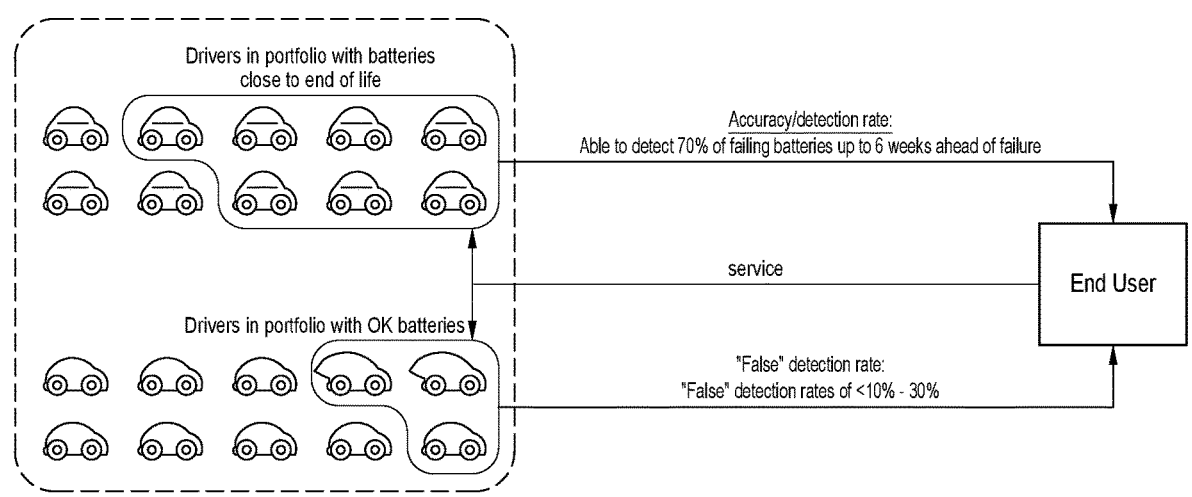
FIG. 9 is a pictorial representation of the accuracy and detection rate of the invention.

FIG. 9 shows one embodiment of method 100 which comprises calculating 110; computing 120; and providing 130 steps. The calculating 110 comprises calculating a plurality of respective prediction values using a plurality of respective algorithms wherein each of the plurality of respective algorithms using historical battery data and current battery data. The computing 120 comprises computing an overall confidence of prediction of battery failure using the plurality of respective prediction values. The providing 130 comprises computing an indication of predicted battery failure based on the computed overall confidence.

Figure 2:
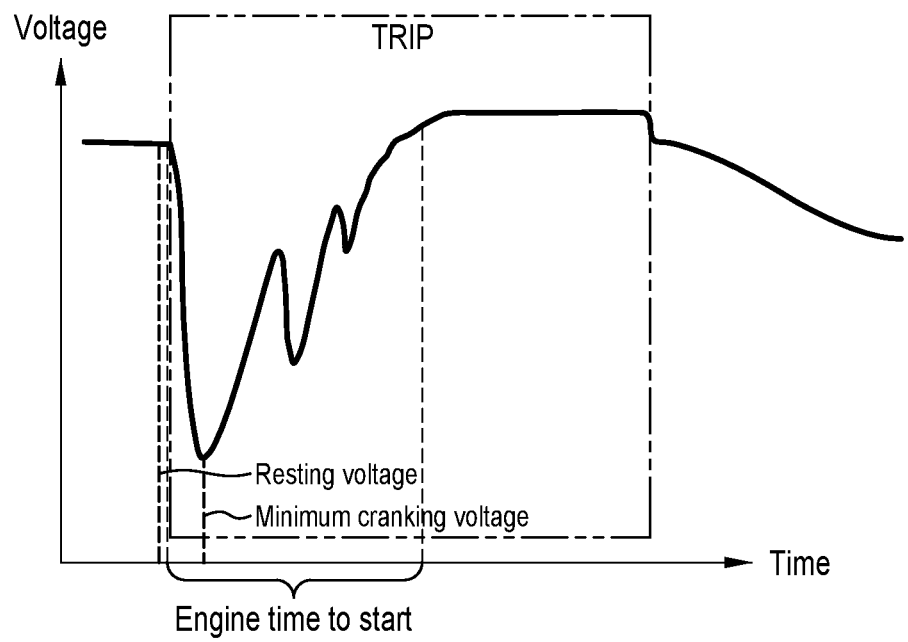
FIG. 2 is a graph showing a typical voltage profile of a battery during one cranking event.

FIG. 2 shows the cranking voltage profile for a conventional battery. There are three important measurements in FIG. 2: the minimum cranking voltage; the resting voltage; and engine time to start. However, the minimum cranking voltage is the most important indicator of battery failure.

Figure 3:
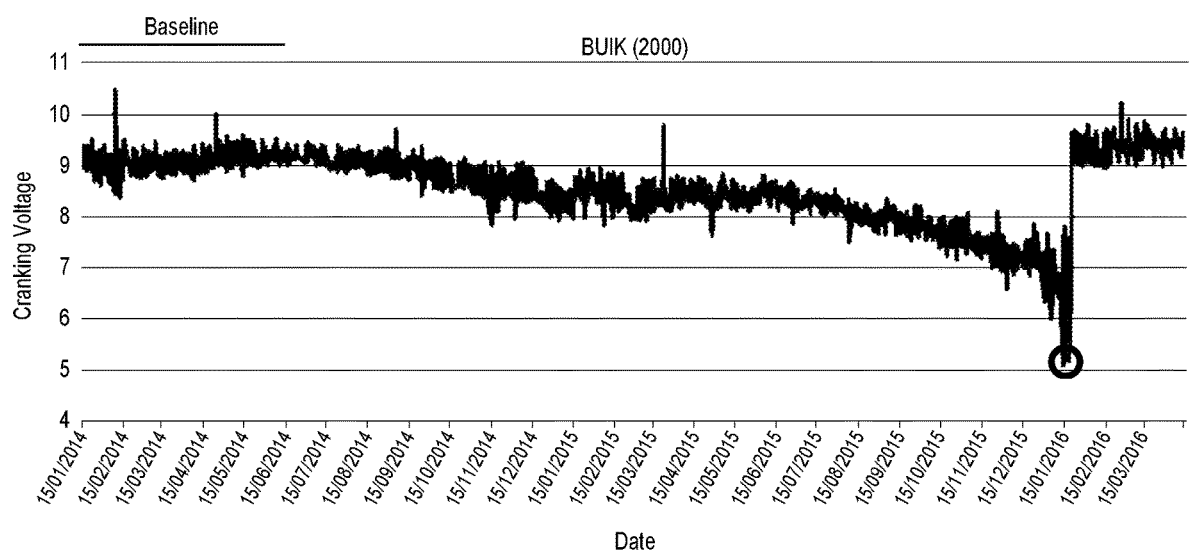
FIG. 3 is a graph showing typical voltage changes of a battery over a lifetime and then replacement with a new battery.

FIG. 3 shows what happens when a battery dies and is replaced. There are two important values in FIG. 3. The first is the historical voltage, which shows the normal cranking voltage of the battery and the second is the current minimum cranking voltage. However, the vehicle's specification is important as well.

Figure 4:
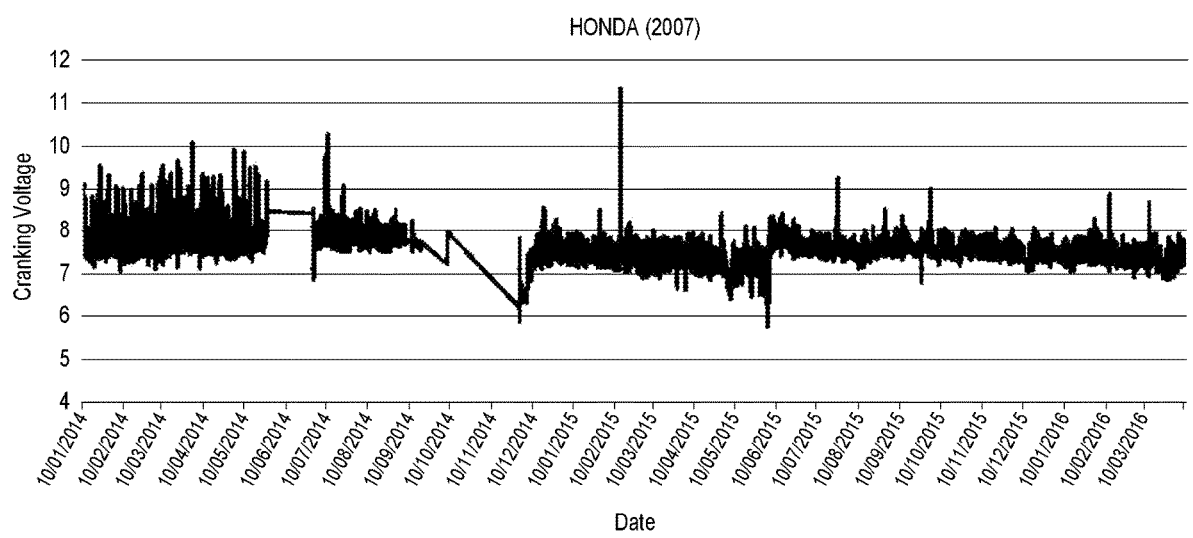
FIG. 4 is another graph showing voltage changes for another battery illustrating that vehicle specification and gaps between trips influence battery lifetime.

FIG. 4 shows that different vehicles can show different paradigm of cranking voltage decline. Also, the above figure shows that the gap between trip is important as well. For example, at Oct. 10, 2014 the vehicle experiencing a low voltage because of a big gap between trips.

Figure 5:
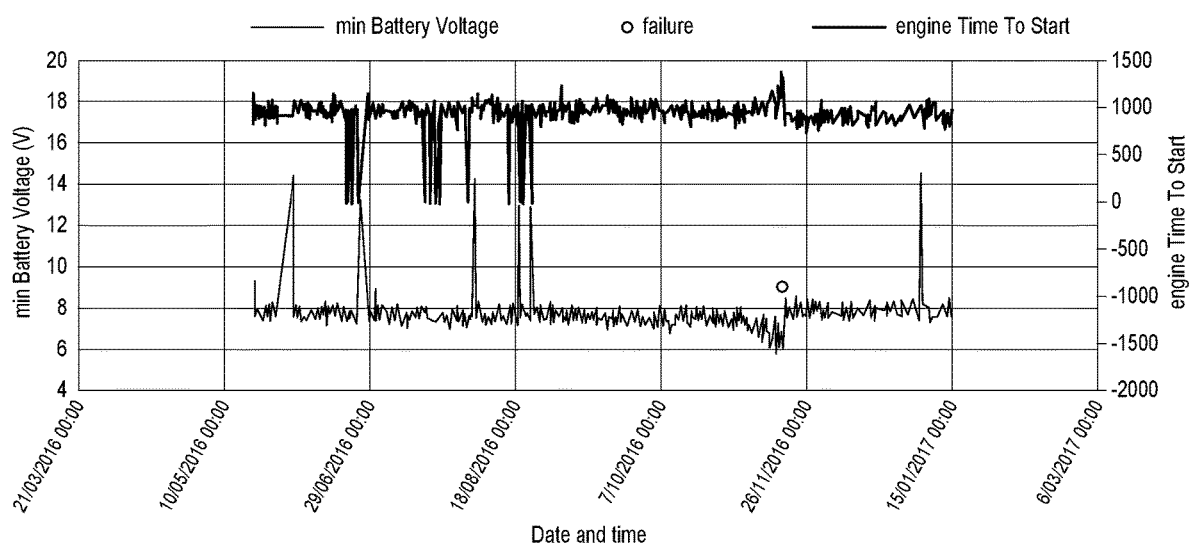
FIG. 5 is a graph showing minimum battery voltage (bottom) and engine time to start (top) with time. Also illustrated with a single dot is a failure event.

FIG. 5 illustrates how, as mentioned above, the engine time to start can be another indicator of battery failure.

Figure 6:
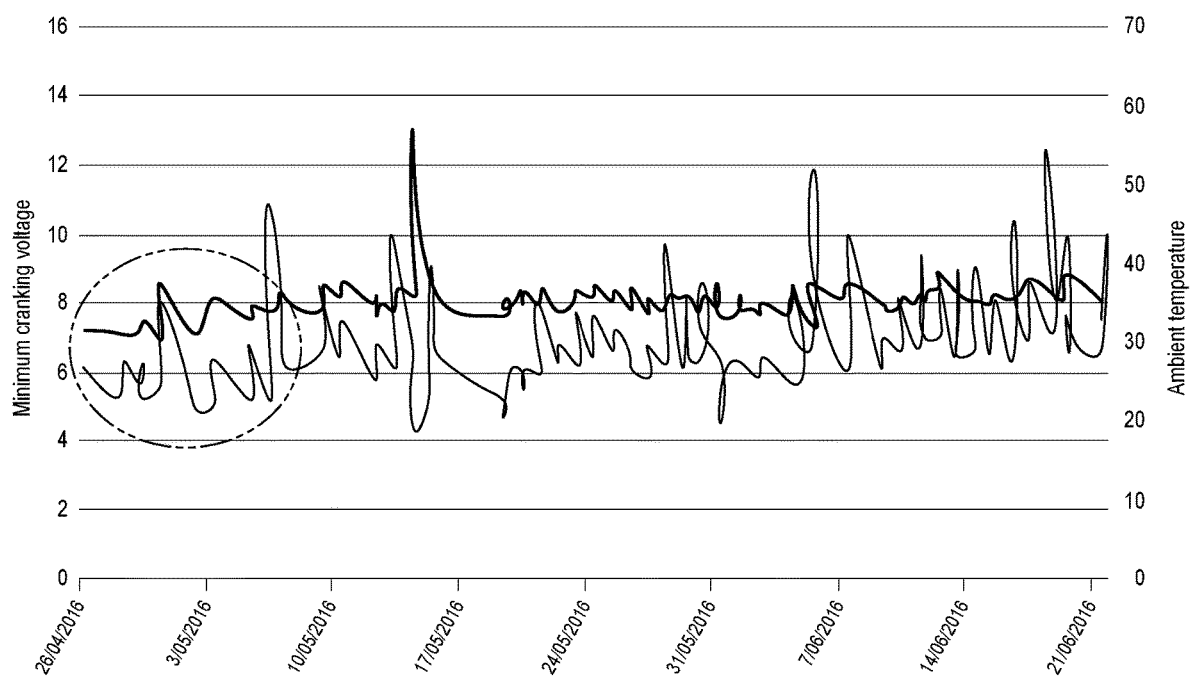
FIG. 6 is another graph illustrating that the minimum cranking voltage is influenced by ambient temperature.

FIG. 6 shows how the minimum cranking voltage follows the ambient temperature.

The input data comprises historical battery data and current battery data. The historical battery data and the current battery data may each comprise the most important indicators of battery failure. With an extensive analysis of data for vehicles that have had a battery failure, the inventors extracted these important factors as input for the method 100 and system 300 of the invention. Exemplary input data is shown in Table 1 below.

This input data is provided as an input to the plurality of respective algorithms.

The plurality of algorithms may comprise one or more of: a rule based algorithm; a random forests algorithm; a deep learning algorithm; and/or a support vector machine algorithm. Each of the plurality of algorithms may indicate a respective confidence level in its prediction of battery failure or non-failure. In a particular embodiment the plurality of algorithms comprises a rule based algorithm; a random forests algorithm; a deep learning algorithm; and a support vector machine algorithm. The plurality of algorithms may comprise two; two or more; three; three or more; four; four or more; five; five or more; six; six or more; seven; seven or more; eight; eight or more; nine; nine or more; ten; or ten or more algorithms. At least one or each of the plurality of algorithms may comprise a machine learning algorithm.

A selection of the plurality of algorithms may be performed. The selection may be based on the device information.

The historical battery data may comprise at least one historical trip of a vehicle. The historical battery data may comprise 1; 2; 3; 4; 5; 6; 7; 8; 9; 10; 11; 12; 13; 14; 15; 16; 17; 18; 19; 20; 21; 22; 23; 24; 25; 30; 35; 40; 45; 50; 60; 70; 80; 90; 100; 150; 200; 300; 400 or 500 historical trips. The historical battery data may comprise at least 2; at least 3; at least 4; at least 5; at least 10; at least 15; at least 20; at least 25; at least 30; at least 40; at least 50; at least 60; at least 70; at least 80; at least 90; or at least 100 historical trips.

The current battery data may comprise current intrinsic battery data such as, one or more of the minimum crank voltage of the battery; voltage of the battery immediately before cranking; resting voltage; engine time to start; battery temperature; and one or more battery specification. The current one or more battery specification may comprise one or more of manufacturer; type; and batch. The minimum crank voltage may be reported during the trip.

The historical battery data may comprise historical intrinsic battery data such as, one or more of the minimum crank voltage of the battery; voltage of the battery immediately before cranking; resting voltage; engine time to start; battery temperature; and one or more battery specification. The historical one or more battery specification may comprise one or more of manufacturer; type; and batch.

Both the current battery data and historical battery data may also comprise respective current vehicle data and historical battery data such as, one or more of vehicle make; vehicle model; vehicle year; vehicle unique identification.

The current battery data and historical battery data may comprise respective current auxiliary data such as transmission device specification which may comprise one or more of transmission device manufacture; transmission device configuration; and detail of voltage sampling frequency.

Both the current battery data and historical battery data may additionally comprise respective extrinsic data such as, one or more of ambient temperature data; location data; a trip start time; and a trip end time.

The current battery data and historical battery data location data may comprise current trip start location and current trip end location and historical trip start location and historical trip end location, respectively. Where available, the location data may comprise latitude and longitude coordinates.

The ambient temperature data may be obtained by querying an online database such as, a weather database, using location data and/or one or more of trip start time and trip end time comprised in the historical battery data or current battery data. The location data may be obtained using GPS data to ensure ambient temperature from the correct location. The trip start location and/or trip end location may be used to obtain a trip temperature from, for example, a weather database. The ambient temperature data may be received or obtained from the transmission device or a database.

The current battery data may comprise an ongoing or most recent trip relating to the battery of the vehicle.

Battery data measured for one trip may subsequently be recorded as historical battery data. Accordingly, over time, the amount of data used for the failure calculation increases.

The historical battery data may comprise one or more averaged historical parameter such as, averaged historical minimum cranking voltage. The averaged historical parameter may be averaged over the complete historical battery data set or a subset thereof. The subset may exclude one or more outlier selected such as due to an extreme temperature or adverse event such as, low voltage due to abnormal battery load for example, due to lights or other auxiliary left on.

The historical battery data and current battery data may comprise a data subset for each trip. Each data subset may comprise any one or more of intrinsic battery data; vehicle data, auxiliary data;

Each of the current battery data and historical battery data intrinsic vehicle data may comprise at least the minimum cranking voltage. In another particular embodiment, the resting voltage may be nullable.

In one particular embodiment the input data comprises: historical battery data for x trips, for example 30 trips or 100 trips, comprising: vehicle unique identification; transmission device specification; trip start and/or end time; ambient temperature; and minimum cranking voltage; current battery data comprising: vehicle unique identification; trip start and/or end time; ambient temperature; and minimum cranking voltage;
and sourced from either historical battery data or current battery data: transmission device type; transmission device detail of voltage sampling frequency; vehicle make; vehicle model; and vehicle year.

The prediction may be triggered by a trip end. The trip end may also initiate a trip data package comprising trip or current battery data.

The computation 120 of an overall confidence may comprise one or more of: a latest failure prediction date; the latest failure prediction date feedback; and a latest prediction for one or more of the plurality of respective algorithms. The latest prediction may comprise a cross-validation value such as, a k fold cross validation or k*l-fold cross-validation. The cross-validation value may comprise a k value.

The computation 120 of an overall confidence may also comprise one or more respective historical prediction for each respective plurality of respective algorithms as an input. The one or more historical prediction may be based on one or more rule. The one or more rule may comprise summing the respective prediction values.

The indication of predicted battery failure may be a confidence percentage that the battery will fail within a predetermined amount of time. This predetermined amount of time may be communicated to a user in any number of ways to enhance user experience and may comprise a fuzzy logic duration such as, soon. The predetermined amount of time and/or fuzzy logic duration may comprise 7 days; 14 days; 21 days; 28 days; 1 month; 6 weeks; 2 months; 3 months; 6 months; or 12 months.

Figure 7:
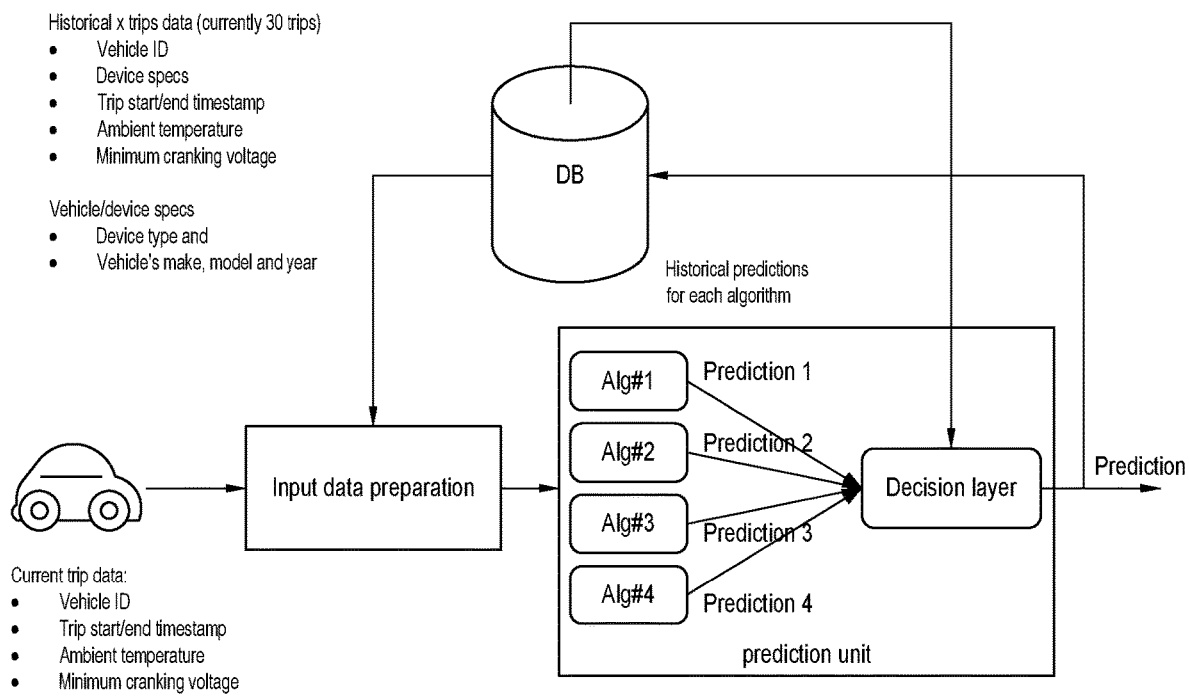
FIG. 7 is another flowchart illustrating a method according to one embodiment of the invention.
Figure 8:
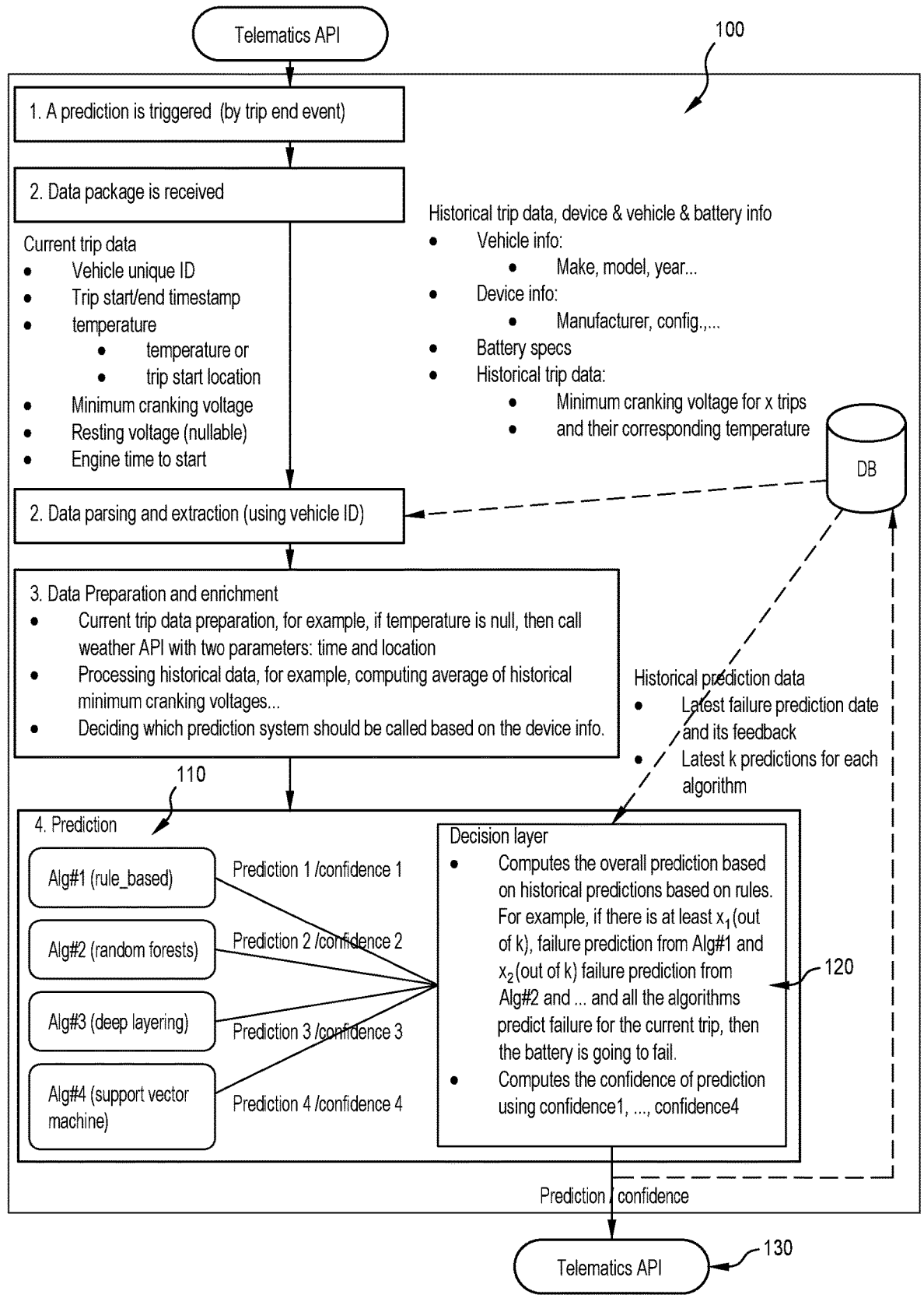
FIG. 8 is yet another flowchart illustrating another method according to one embodiment of the invention.

FIG. 7 shows more details about steps 110; 120 and 130. The input data may be prepared for the algorithm, in an "input data preparation" unit. The "prediction unit" may consist of four different machine-learning algorithms. Each of the algorithms takes the input data, predicts the state of health independently and then sends the prediction to the decision layer. Decision layer takes all the current predictions and also k historical predictions, then predicts if the battery is going to fail "soon" or not.

Similar to any other types of prediction, the inventor's battery failure algorithm is not correct always, when it predicts a failure. In other words, there may be misprediction for some vehicles. These may be referred to as "false positives" which are the complementary of true positives (or "accuracy"). For example, if we assess the accuracy as 70%, this means the false positive rate is 30%. In addition, some failures may be missed such that a failure event is not predicted for some batteries. This is used to measure the detection rate, which is the percentage of actual battery failures that are detect. For example, if the detection rate is measured as 60%, this means that 60 percent of failures are detected, and 40 percent are missed.

FIG. 9 shows these measures visually. To date, testing has shown a detection rate for method 100 and system 300 of 70% and an accuracy of 70%. However, this does not mean an incorrect determination is made for the rest of the vehicles. In many cases, an early detection is provided rather than a misprediction. Of the three vehicles encircled in the bottom set of vehicles in FIG. 9, the top two represent vehicles that have an early detection for them, and they are not completely healthy.

Figure 10A:
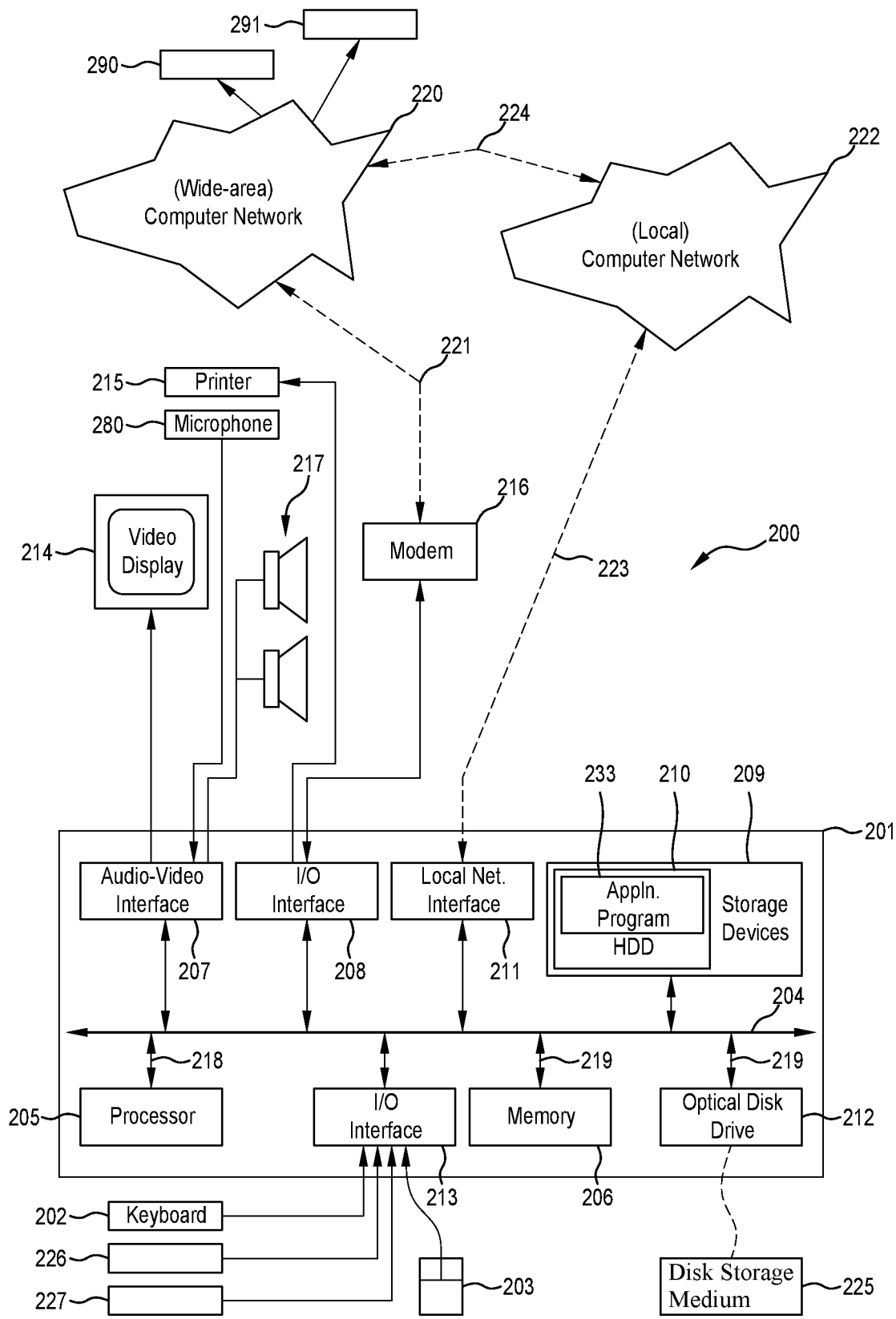
FIGS. 10A and 10B are schematic diagrams showing an exemplary computer system for use in embodiments of the present invention.
Figure 10B:
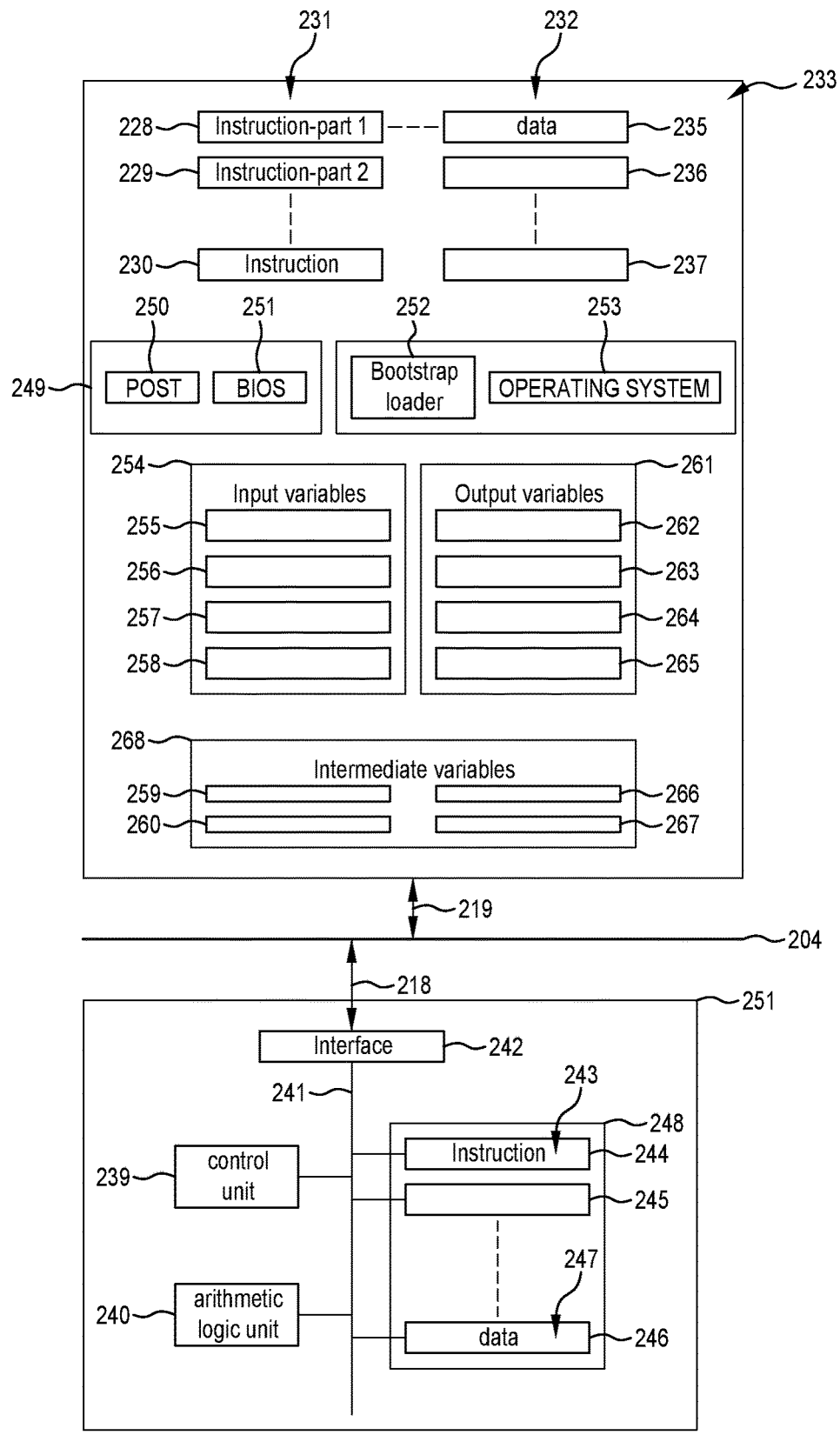

One embodiment of a computing device suitable for use in the present invention is shown in FIGS. 10A and 10B. In the embodiment shown, computing device 200 comprises a computer module 201 comprising input devices such as a keyboard 202, a mouse pointer device 203, a scanner 226, an external hard drive 227, and a microphone 280; and output devices including a printer 215, a display device 214 and loudspeakers 217. In some embodiments video display 214 may comprise a touchscreen.

A network connection device 216 such as, a transceiver, which may be in the form of a modulator-demodulator (modem) device, may be used by the computer module 201 for communicating to and from a communications network 220 via a connection 221. The network 220 may be a wide-area network (WAN), such as the Internet, a cellular telecommunications network, or a private WAN. Through the network 220, computer module 201 may be connected to other similar personal devices 290 or server computers 291. Where the connection 221 is a telephone line, the modem 216 may be a traditional "dial-up" modem. Alternatively, where the connection 221 is a high capacity (e.g.: cable) connection, the modem 216 may be a broadband modem. A wireless modem may also be used for wireless connection to network 220.

The computer module 201 typically includes at least one processor 205, and a memory 206 for example formed from semiconductor random access memory (RAM) and semiconductor read only memory (ROM). The module 201 also includes a number of input/output (I/O) interfaces including: an audio-video interface 207 that couples to the video display 214, loudspeakers 217 and microphone 280; an I/O interface 213 for the keyboard 202, mouse 203, scanner 226 and external hard drive 227; and an interface 208 for the external modem 216 and printer 215. In some implementations, modem 216 may be incorporated within the computer module 201, for example within the interface 208. The computer module 201 also has a local network interface 211 which, via a connection 223, permits coupling of the computing device 200 to a local computer network 222, known as a Local Area Network (LAN).

As also illustrated, the local network 222 may also couple to the wide network 220 via a connection 224, which would typically include a so-called "firewall" device or device of similar functionality. The interface 211 may be formed by an Ethernet circuit card, a Bluetooth wireless arrangement or an IEEE 802.11 wireless arrangement or other suitable interface.

The I/O interfaces 208 and 213 may afford either or both of serial and parallel connectivity, the former typically being implemented according to the Universal Serial Bus (USB) standards and having corresponding USB connectors (not illustrated).

Storage devices 209 are provided and typically include a hard disk drive (HDD) 210. Other storage devices such as, an external HD 227, a disk drive (not shown) and a magnetic tape drive (not shown) may also be used. An optical disk drive 212 is typically provided to act as a non-volatile source of data. Portable memory devices, such as optical disks (e.g.: CD-ROM, DVD, Blu-Ray Disc), USB-RAM, external hard drives and floppy disks for example, may be used as appropriate sources of data to the computing device 200. Another source of data to computing device 200 is provided by the at least one server computer 291 through network 220. Although not shown, the at least one server computer 291 may be operatively connected to one or more database 292.

The components 205 to 213 of the computer module 201 typically communicate via an interconnected bus 204 in a manner that results in a conventional mode of operation of computing device 200. In the embodiment shown in FIGS. 2A and 2B, processor 205 is coupled to system bus 204 through connections 218. Similarly, memory 206 and optical disk drive 212 are coupled to the system bus 204 by connections 219. Examples of computing devices 200 on which the described arrangements can be practiced include IBM-PC's and compatibles, Sun Sparc stations, Apple computers; smart phones; tablet computers or a like device comprising a computer module like computer module 201. It is to be understood that when computing device 200 comprises a smart phone or a tablet computer, display device 214 may comprise a touchscreen and other input and output devices may not be included such as, mouse pointer device 203; keyboard 202; scanner 226; and printer 215.

FIG. 2B is a detailed schematic block diagram of processor 205 and a memory 234. The memory 234 represents a logical aggregation of all the memory modules, including the storage device 209 and semiconductor memory 206, which can be accessed by the computer module 201 in FIG. 2A.

The methods of the invention may be implemented using computing device 200 wherein the methods may be implemented as one or more software application programs 233 executable within computer module 201. In particular, the steps of the methods of the invention may be effected by instructions 231 in the software carried out within the computer module 201.

The software instructions 231 may be formed as one or more code modules, each for performing one or more tasks. The software 233 may also be divided into two separate parts, in which a first part and the corresponding code modules performs the method of the invention and a second part and the corresponding code modules manage a graphical user interface between the first part and the user.

The software 233 may be stored in a computer readable medium, including in a storage device of a type described herein. The software is loaded into the computing device 200 from the computer readable medium or through network 221 or 223, and then executed by computing device 200. In one example the software 233 is stored on storage medium 225 that is read by optical disk drive 212. Software 233 is typically stored in the HDD 210 or the memory 206.

A computer readable medium having such software 233 or computer program recorded on it is a computer program product. The use of the computer program product in the computing device 200 preferably effects a device or apparatus for implementing the methods of the invention.

In some instances, the software application programs 233 may be supplied to the user encoded on one or more disk storage medium 225 such as a CD-ROM, DVD or Blu-Ray disc, and read via the corresponding drive 212, or alternatively may be read by the user from the networks 220 or 222. Still further, the software can also be loaded into the computing device 200 from other computer readable media. Computer readable storage media refers to any non-transitory tangible storage medium that provides recorded instructions and/or data to the computer module 201 or computing device 200 for execution and/or processing. Examples of such storage media include floppy disks, magnetic tape, CD-ROM, DVD, Blu-ray Disc, a hard disk drive, a ROM or integrated circuit, USB memory, a magneto-optical disk, or a computer readable card such as a PCMCIA card and the like, whether or not such devices are internal or external of the computer module 201. Examples of transitory or non-tangible computer readable transmission media that may also participate in the provision of software application programs 233, instructions 231 and/or data to the computer module 201 include radio or infra-red transmission channels as well as a network connection 221, 223, 334, to another computer or networked device 290, 291 and the Internet or an Intranet including email transmissions and information recorded on Websites and the like.

The second part of the application programs 233 and the corresponding code modules mentioned above may be executed to implement one or more graphical user interfaces (GUIs) to be rendered or otherwise represented upon display 214. Through manipulation of, typically, keyboard 202, mouse 203 and/or screen 214 when comprising a touchscreen, a user of computing device 200 and the methods of the invention may manipulate the interface in a functionally adaptable manner to provide controlling commands and/or input to the applications associated with the GUI(s). Other forms of functionally adaptable user interfaces may also be implemented, such as an audio interface utilizing speech prompts output via loudspeakers 217 and user voice commands input via microphone 280. The manipulations including mouse clicks, screen touches, speech prompts and/or user voice commands may be transmitted via network 220 or 222.

When the computer module 201 is initially powered up, a power-on self-test (POST) program 250 may execute. The POST program 250 is typically stored in a ROM 249 of the semiconductor memory 206. A hardware device such as the ROM 249 is sometimes referred to as firmware. The POST program 250 examines hardware within the computer module 201 to ensure proper functioning, and typically checks processor 205, memory 234 (209, 206), and a basic input-output systems software (BIOS) module 251, also typically stored in ROM 249, for correct operation. Once the POST program 250 has run successfully, BIOS 251 activates hard disk drive 210. Activation of hard disk drive 210 causes a bootstrap loader program 252 that is resident on hard disk drive 210 to execute via processor 205. This loads an operating system 253 into RAM memory 206 upon which operating system 253 commences operation. Operating system 253 is a system level application, executable by processor 205, to fulfil various high level functions, including processor management, memory management, device management, storage management, software application interface, and generic user interface.

Operating system 253 manages memory 234 (209, 206) in order to ensure that each process or application running on computer module 201 has sufficient memory in which to execute without colliding with memory allocated to another process. Furthermore, the different types of memory available in the computing device 200 must be used properly so that each process can run effectively. Accordingly, the aggregated memory 234 is not intended to illustrate how particular segments of memory are allocated, but rather to provide a general view of the memory accessible by computer module 201 and how such is used.

Processor 205 includes a number of functional modules including a control unit 239, an arithmetic logic unit (ALU) 240, and a local or internal memory 248, sometimes called a cache memory. The cache memory 248 typically includes a number of storage registers 244, 245, 246 in a register section storing data 247. One or more internal busses 241 functionally interconnect these functional modules. The processor 205 typically also has one or more interfaces 242 for communicating with external devices via the system bus 204, using a connection 218. The memory 234 is connected to the bus 204 by connection 219.

Application program 233 includes a sequence of instructions 231 that may include conditional branch and loop instructions. Program 233 may also include data 232 which is used in execution of the program 233. The instructions 231 and the data 232 are stored in memory locations 228, 229, 230 and 235, 236, 237, respectively. Depending upon the relative size of the instructions 231 and the memory locations 228-230, a particular instruction may be stored in a single memory location as depicted by the instruction shown in the memory location 230. Alternately, an instruction may be segmented into a number of parts each of which is stored in a separate memory location, as depicted by the instruction segments shown in the memory locations 228 and 229.

In general, processor 205 is given a set of instructions 243 which are executed therein. The processor 205 then waits for a subsequent input, to which processor 205 reacts by executing another set of instructions. Each input may be provided from one or more of a number of sources, including data generated by one or more of the input devices 202, 203, or 214 when comprising a touchscreen, data received from an external source across one of the networks 220, 222, data retrieved from one of the storage devices 206, 209 or data retrieved from a storage medium 225 inserted into the corresponding reader 212. The execution of a set of the instructions may in some cases result in output of data. Execution may also involve storing data or variables to the memory 234.

The disclosed arrangements use input variables 254 that are stored in the memory 234 in corresponding memory locations 255, 256, 257, 258. The described arrangements produce output variables 261 that are stored in the memory 234 in corresponding memory locations 262, 263, 264, 265. Intermediate variables 268 may be stored in memory locations 259, 260, 266 and 267.

The register section 244, 245, 246, the arithmetic logic unit (ALU) 240, and the control unit 239 of the processor 205 work together to perform sequences of micro-operations needed to perform "fetch, decode, and execute" cycles for every instruction in the instruction set making up the program 233. Each fetch, decode, and execute cycle comprises:

(a) a fetch operation, which fetches or reads an instruction 231 from memory location 228, 229, 230;

(b) a decode operation in which control unit 239 determines which instruction has been fetched; and (c) an execute operation in which the control unit 239 and/or the ALU 240 execute the instruction.

Thereafter, a further fetch, decode, and execute cycle for the next instruction may be executed. Similarly, a store cycle may be performed by which the control unit 239 stores or writes a value to a memory location 232.

Each step or sub-process in the methods of the invention may be associated with one or more segments of the program 233, and may be performed by register section 244-246, the ALU 240, and the control unit 239 in the processor 205 working together to perform the fetch, decode, and execute cycles for every instruction in the instruction set for the noted segments of program 233.

One or more other computers 290 may be connected to the communications network 220 as seen in FIG. 2A. Each such computer 290 may have a similar configuration to the computer module 201 and corresponding peripherals.

One or more other server computer 291 may be connected to the communications network 220. These server computers 291 respond to requests from the personal device or other server computers to provide information.

Methods of the present invention may alternatively be implemented in dedicated hardware such as one or more integrated circuits performing the functions or sub functions of the described methods. Such dedicated hardware may include graphic processors, digital signal processors, or one or more microprocessors and associated memories.

It will be understood that in order to practice the method 100 of the invention as described above, it is not necessary that the processors and/or the memories of the processing machine be physically located in the same geographical place. That is, each of the processors and the memories used in the invention may be located in geographically distinct locations and connected so as to communicate in any suitable manner. Additionally, it will be understood that each of the processor and/or the memory may be composed of different physical pieces of equipment. Accordingly, it is not necessary that a processor be one single piece of equipment in one location and that the memory be another single piece of equipment in another location. That is, it is contemplated that the processor may be two pieces of equipment in two different physical locations. The two distinct pieces of equipment may be connected in any suitable manner. Additionally, the memory may include two or more portions of memory in two or more physical locations.

To explain further, processing as described above is performed by various components and various memories. It will be understood, however, that the processing performed by two distinct components as described above may, in accordance with a further embodiment of the invention be performed by a single component. Further, the processing performed by one distinct component as described above may be performed by two distinct components. In a similar manner, the memory storage performed by two distinct memory portions as described above may, in accordance with a further embodiment of the invention, be performed by a single memory portion. Further, the memory storage performed by one distinct memory portion as described above may be performed by two memory portions.

Further, various technologies may be used to provide communication between the various processors and/or memories, as well as to allow the processors and/or the memories of the invention to communicate with any other entity, i.e., so as to obtain further instructions or to access and use remote memory stores, for example. Such technologies used to provide such communication might include a network, the Internet, Intranet, Extranet, LAN, an Ethernet, a telecommunications network (e.g., a cellular or wireless network) or any client server system that provides communication, for example. Such communications technologies may use any suitable protocol such as TCP/IP, UDP, or OSI, for example.

In this specification, the terms "comprises", "comprising" or similar terms are intended to mean a non-exclusive inclusion, such that an apparatus that comprises a list of elements does not include those elements solely, but may well include other elements not listed.

Throughout the specification the aim has been to describe the invention without limiting the invention to any one embodiment or specific collection of features. Persons skilled in the relevant art may realize variations from the specific embodiments that will nonetheless fall within the scope of the invention.

TABLE 1

| Field | Description | Data type | Mandatory/Optional | Comments |
| --- | --- | --- | --- | --- |
| Vehicle ID | Unique identifier of the vehicle | ID | M | |
| Device type/specs | The type and specification of the dongle device | ID | M | |
| Trip Start timestamp | Timestamp when the trip started | Date-time | M | |
| Trip Start latitude/longitude (preferred) Or First Ambient Temperature from the device that can show temperature when cranking happens | Lat and Long coordinates of trip start address or ambient temperature in Celsius | Decimal | M | |
| Min Crank Voltage And/Or high frequency voltage trace so that we can extract Min Crank Voltage from that. | Minimum crank voltage reported by the device during the trip | Decimal | M | |
| Trip End timestamp | Timestamp when the trip ends | Date-time | M | This will enable to calculate the trip duration and gaps between trips |
| Resting Voltage | Voltage of the battery right before cranking. | Decimal | O | |
| Engine time to start | The time that takes the engine to start | millisecond | O | |
| Make | Vehicle manufacturer | Text | O | |
| Model | Vehicle model | Text | O | |
| Year | Vehicle year | Text | O | |
| Battery Specs including battery type/age/... | Type of the vehicle battery | Text | O | The algorithm doesn't supports the Hybrid vehicles. |

What is claimed is:

1. A computer-implemented method for predicting battery failure comprising:

calculating a plurality of respective prediction values using a plurality of respective algorithms, each of the plurality of respective algorithms using historical battery data and current battery data;

computing an overall confidence of prediction of battery failure using the plurality of respective prediction values; and providing an indication of predicted battery failure based on the computed overall confidence.

2. The method of claim 1 wherein the indication of predicted battery failure is a confidence percentage that the battery will fail within a predetermined amount of time.

3. The method of claim 1 wherein the plurality of algorithms comprises one or more of: a rule based algorithm; a random forests algorithm; a deep learning algorithm; and/or a support vector machine algorithm.

4. The method of claim 1 wherein the plurality of algorithms comprises a rule based algorithm; a random forests algorithm; a deep learning algorithm; and a support vector machine algorithm.

5. The method of claim 1 wherein at least one or each of the plurality of algorithms comprise a machine learning algorithm.

6. The method of claim 1 wherein a selection of the plurality of algorithms is performed.

7. The method of claim 3 wherein each of the plurality of algorithms indicate a respective confidence level in its prediction of battery failure or non-failure.

8. The method of claim 6 wherein the selection is based on the device information.

9. A computer-implemented system for predicting battery failure comprising:
one or more processor calculating a plurality of respective prediction values using a plurality of respective algorithms, each of the plurality of respective algorithms using historical battery data and current battery data;
the one or more processor computing an overall confidence of prediction of battery failure using the plurality of respective prediction values; and
the one or more processor providing an indication of predicted battery failure based on the computed overall confidence.

10. The system of claim 9 wherein the indication of predicted battery failure is a confidence percentage that the battery will fail within a predetermined amount of time.

11. The system of claim 9 wherein the plurality of algorithms comprises one or more of: a rule based algorithm; a random forests algorithm; a deep learning algorithm; and/or a support vector machine algorithm.

12. The system of claim 9 wherein the plurality of algorithms comprises a rule based algorithm; a random forests algorithm; a deep learning algorithm; and a support vector machine algorithm.

13. The system of claim 9 wherein at least one or each of the plurality of algorithms comprise a machine learning algorithm.

14. The system of claim 9 wherein a selection of the plurality of algorithms is performed.

15. The system of claim 11 wherein each of the plurality of algorithms indicate a respective confidence level in its prediction of battery failure or non-failure.

16. The system of claim 14 wherein the selection is based on the device information.

17. A computer program product comprising:
a computer usable medium and computer readable program code embodied on said computer usable medium for predicting battery failure comprising:
computer readable program code devices (i) configured to cause the computer to calculate a plurality of respective prediction values using a plurality of respective algorithms, each of the plurality of respective algorithms using historical battery data and current battery data;
computer readable program code devices (ii) configured to cause the computer to compute an overall confidence of prediction of battery failure using the plurality of respective prediction values; and
computer readable program code devices (iii) configured to cause the computer to provide an indication of predicted battery failure based on the computed overall confidence.

18. The product of claim 17 wherein the indication of predicted battery failure is a confidence percentage that the battery will fail within a predetermined amount of time.

19. The product of claim 17 wherein the plurality of algorithms comprise one or more of: a rule based algorithm; a random forests algorithm; a deep learning algorithm; and/or a support vector machine algorithm.

20. The product of claim 17 wherein the plurality of algorithms comprises a rule based algorithm; a random forests algorithm; a deep learning algorithm; and a support vector machine algorithm.

21. The product of claim 17 wherein a selection of the plurality of algorithms is performed.

22. The product of claim 19 wherein each of the plurality of algorithms indicate a respective confidence level in its prediction of battery failure or non-failure.

* * * * *